United States Patent
Dang et al.

(10) Patent No.: US 9,431,609 B2
(45) Date of Patent: Aug. 30, 2016

(54) OXIDE FILM SCHEME FOR RRAM STRUCTURE

(71) Applicant: Taiwan Semiconductor Manufacturing Co., Ltd., Hsin-Chu (TW)

(72) Inventors: Trinh Hai Dang, Hsinchu (TW); Hsing-Lien Lin, Hsin-Chu (TW); Cheng-Yuan Tsai, Chu-Pei (TW); Chia-Shiung Tsai, Hsin-Chu (TW); Ru-Liang Lee, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 34 days.

(21) Appl. No.: 14/459,361

(22) Filed: Aug. 14, 2014

(65) Prior Publication Data
US 2016/0049584 A1 Feb. 18, 2016

(51) Int. Cl.
*H01L 21/00* (2006.01)
*H01L 45/00* (2006.01)

(52) U.S. Cl.
CPC ....... *H01L 45/1616* (2013.01); *H01L 45/1233* (2013.01); *H01L 45/1253* (2013.01); *H01L 45/146* (2013.01); *H01L 45/147* (2013.01)

(58) Field of Classification Search
CPC ............. H01L 29/511; H01L 45/1233; H01L 45/1253; H01L 45/146; H01L 45/147
See application file for complete search history.

(56) References Cited

U.S. PATENT DOCUMENTS

| 8,420,478 B2 | 4/2013 | Chiang et al. |
| 2014/0034894 A1 | 2/2014 | Adelmann et al. |

FOREIGN PATENT DOCUMENTS

WO 2010117818 A2 10/2010

OTHER PUBLICATIONS

Duncan, et al. "Calculations for Hydrogen-Doped HfO2-x RRAM." The American Physical Society. Nov. 15, 2013.
Capron, et al. "Migration of Oxygen Vacancy in HfO2 and Across the HfO2 /SiO2 Interface: A first-Principles Investigation." Applied Physics Letters 91, 192905. Published Nov. 7, 2007.
McKenna, et al. "The Interaction of Oxygen Vacancies with Grain Boundaries in Monoclinic HfO2." Applied Physics Letters 95, 222111. Published Dec. 3, 2009.

(Continued)

*Primary Examiner* — Richard Booth
(74) *Attorney, Agent, or Firm* — Eschweiler & Associates, LLC

(57) ABSTRACT

The present disclosure relates to a method of forming an RRAM cell having a dielectric data layer that provides good performance, device yield, and data retention, and an associated apparatus. In some embodiments, the method is performed by forming an RRAM film stack having a bottom electrode layer disposed over a semiconductor substrate, a top electrode layer, and a dielectric data storage layer disposed between the bottom electrode and the top electrode. The dielectric data storage layer has a performance enhancing layer with a hydrogen-doped oxide and a data retention layer having an aluminum oxide. The RRAM film stack is then patterned according to one or more masking layers to form a top electrode and a bottom electrode, and an upper metal interconnect layer is formed at a position electrically contacting the top electrode.

20 Claims, 6 Drawing Sheets

(56) References Cited

OTHER PUBLICATIONS

Bersuker, et al. "Metal Oxide Resistive Memory Switching Mechanism Based on Conductive Filament Properties." Journal of Applied Physics 110, 124518. Published Dec. 29, 2011.

Fantini, et al. "Engineering of Hf1-xAlxOy Amorphous Dielectrics for High-Performance RRAM Applications." Memory Workshop (IMW), 2014 IEEE 6th International , vol., no., pp. 1,4, May 18-21, 2014.

OXIDE FILM SCHEME FOR RRAM STRUCTURE

BACKGROUND

Metal-insulator metal (MIM) structures comprise a dielectric data storage layer disposed between conductive layers (e.g., metal layers). The conductive layers have free charge carriers (e.g., holes and/or electrons) that allow for electrical charges to easily travel and thereby apply a voltage bias to the dielectric data storage layer. In the presence of various voltage biases, the dielectric data storage layer is configured to undergo a reversible change between resistive states corresponding to electrical data states (e.g., "1s" and "0s").

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
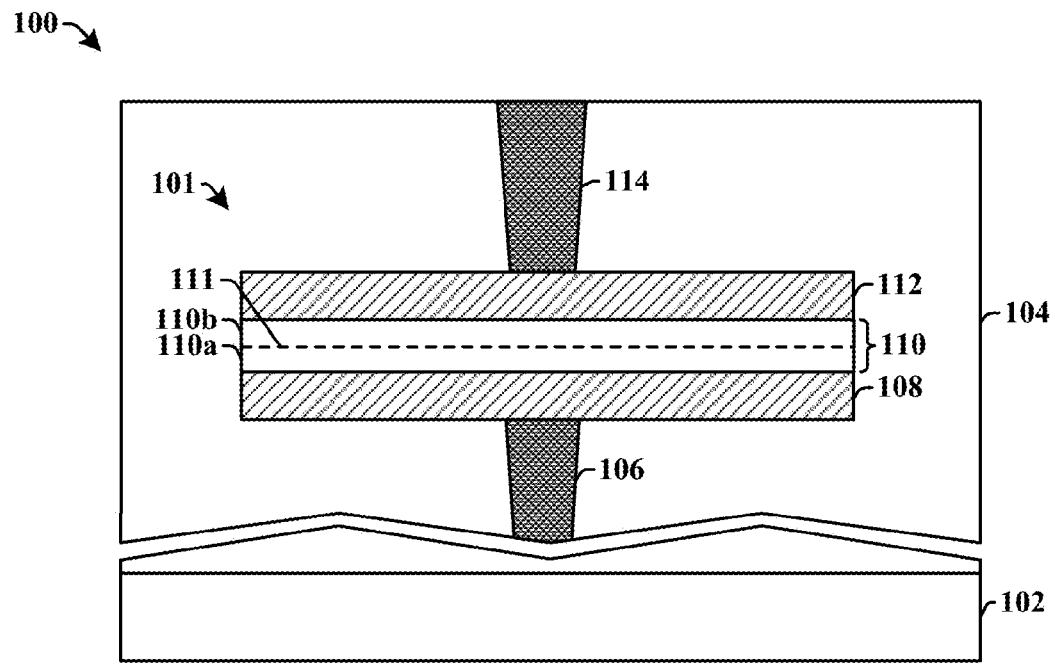
FIG. 1 illustrates a cross-sectional view of some embodiments of an integrated chip comprising an RRAM (resistive random access memory) cell having a dielectric data storage layer with a performance enhancing layer and a data retention layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In recent years, resistive random access memory (RRAM) cells have emerged as a promising candidate for a next generation of electronic data storage. In contrast to conventional charge trapping memories (e.g., SRAM, flash, etc.), RRAM cells store data based upon resistive switching. Resistive switching allows for an RRAM cell to change the electrical resistance of a memory cell between a high resistive state corresponding to a first data state (e.g., a "0") and a low resistive state corresponding to a second data state (e.g., a "1").

RRAM cells have a bottom electrode that is separated from an overlying top electrode by a dielectric data storage layer having a variable resistance. The dielectric data storage layer typically comprises a high-k dielectric material that is able to alter its internal resistance in response to an applied bias. There are a wide range of high-k dielectric materials that are currently used in RRAM memory cells. Different high-k dielectric materials provide RRAM cells with different characteristics. For example, some high-k dielectric materials may offer improved performance and/or device yield, while other high-k dielectric materials may offer improved data retention. However, it has been appreciated that most high-k dielectric materials fail to offer both good performance (e.g., forming, set, and/or reset operations), device yield, and data retention.

The present disclosure relates to a method of forming an RRAM cell having a dielectric data layer configured to provide good performance, device yield, and data retention, and an associated apparatus. In some embodiments, the method is performed by forming an RRAM film stack having a bottom electrode layer disposed over a semiconductor substrate, a top electrode layer, and a dielectric data storage layer disposed between the bottom electrode and the top electrode. The dielectric data storage layer comprises a performance enhancing layer having a hydrogen-doped oxide and a data retention layer comprising an aluminum oxide. The RRAM film stack is then patterned according to one or more masking layers to form a top electrode and a bottom electrode, and an upper metal interconnect layer is formed at a position electrically contacting the top electrode. By using a dielectric data storage layer comprising the performance enhancing layer and the data retention layer, the dielectric data storage layer is able to provide the RRAM cell with good performance, yield, and data retention.

FIG. 1 illustrates a cross-sectional view of some embodiments of an integrated chip 100 comprising a resistive random access memory (RRAM) cell 101 having a dielectric data storage layer 110 with a performance enhancing layer 110a and a data retention layer 110b.

The RRAM cell 101 is disposed within an inter-level dielectric (ILD) layer 104 located over a semiconductor substrate 102. The RRAM cell 101 comprises a bottom electrode 108 positioned over one or more lower metal interconnect layers 106 (e.g., a metal via and/or a metal wire), a dielectric data storage layer 110 located over the bottom electrode 108, and a top electrode 112 located over the dielectric data storage layer 110. An overlying metal interconnect layer 114 (e.g., a via) is disposed onto the top electrode 112.

The dielectric data storage layer 110 comprises a performance enhancing layer 110a and a data retention layer 110b. The performance enhancing layer 110a comprises a hydrogen-doped oxide layer (i.e., an oxide layer comprising hydrogen molecules) configured to provide the RRAM cell 101 with good performance voltages (e.g., a low voltage for forming, set, and/or reset operations) and yield. For example, the performance enhancing layer 110a has a lower performance voltage than the data retention layer 110b (e.g., between approximately 0.3V and 0.8V for the same thickness), thereby allowing the performance enhancing layer 110a to reduce the performance voltage of the RRAM cell 101 by a value of between approximately 0.1 V and 0.2 V relative to an RRAM cell not having the performance enhancing layer. The data retention layer 110b comprises an aluminum oxide layer configured to provide the RRAM cell 101 with good data retention capabilities. By combining the performance enhancing layer 110a and the data retention layer 110b within the dielectric data storage layer 110, the dielectric data storage layer 110 is able to provide the RRAM cell 101 with good yield, performance voltage, and data retention capabilities.

In some embodiments, the data retention layer 110b may be disposed over the performance enhancing layer 110a, such that the data retention layer 110b abuts a top surface of the performance enhancing layer 110a. In other embodiments, the data retention layer 110b may be disposed below the performance enhancing layer 110a. In yet other embodiments, the performance enhancing layer 110a and a data retention layer 110b may comprise a same layer (e.g., a hydrogen-doped layer comprising aluminum oxide).

In some embodiments, the performance enhancing layer 110a comprises a first material, and the data retention layer 110b comprises a second material, different than the first material. In some embodiments, the first material of the performance enhancing layer 110a and the second material of the data retention layer 110b may share one or more common elements. For example, in some embodiments, the first and second material may both contain hafnium (Hf) and oxygen (O). In other embodiments, the first and second materials may both contain oxygen (O) and one or more of zirconium (Zr), nickel (Ni), tungsten (W), tantalum (Ta), titanium (Ti) or other similar materials.

Figure 2:
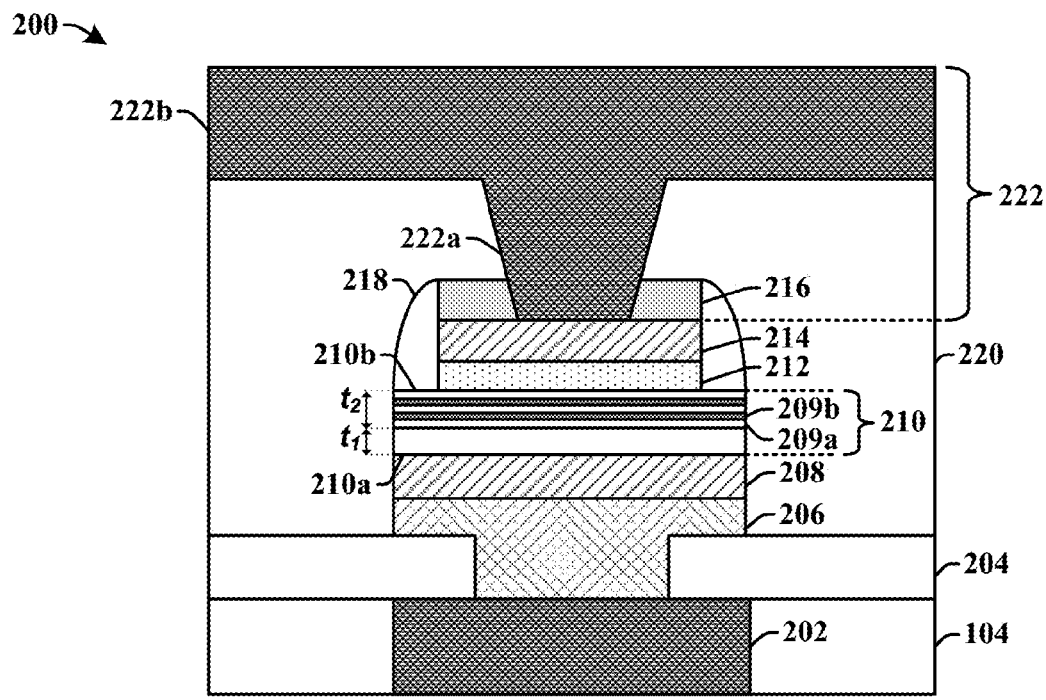
FIG. 2 illustrates a cross-sectional view of some embodiments of an integrated chip comprising a resistive random access memory (RRAM) cell comprising a multi-layer dielectric layer having a performance enhancing layer and an overlying data retention layer.

FIG. 2 illustrates a cross-sectional view of some embodiments of RRAM (resistive random access memory) cell 200 comprising a multi-layer dielectric data storage layer 210 with a performance enhancing layer 210a and a data retention layer 210b.

RRAM cell 200 comprises a bottom electrode 208 located over a lower metal interconnect layer 202 surrounded by a lower inter-level dielectric (ILD) layer 104 within a back-end-of-the-line (BEOL) metallization stack. In some embodiments, the lower metal interconnect layer 202 may comprise one of a plurality of metal interconnect layers disposed between the bottom electrode 208 and an underlying semiconductor substrate (not shown). In some embodiments, a lower insulating layer 204 may be located a position vertically disposed between opposing sides of the lower metal interconnect layer 202 and the bottom electrode 208. In some such embodiments, a diffusion barrier layer 206 may be vertically disposed within a micro-trench in the insulating layer 204.

A multi-layer dielectric data storage layer 210 is disposed over the bottom electrode 208. The multi-layer dielectric data storage layer 210 has a variable resistance, which depending on an applied voltage, will undergo a reversible change between a high resistance state associated with a first data state (e.g., a '0') and a low resistance state associated with a second data state (e.g., a '1'). For example, a voltage applied to the multi-layer dielectric data storage layer 210 will induce conductive paths/filaments (e.g., oxygen vacancies) to form across the multi-layer dielectric data storage layer 210, thereby reducing the resistance of the multi-layer dielectric data storage layer 210.

The multi-layer dielectric data storage layer 210 comprises a performance enhancing layer 210a and a data retention layer 210b, which is disposed onto and in direct contact with a top surface of the performance enhancing layer 210a. The performance enhancing layer 110a comprises a hydrogen-doped oxide layer and the data retention layer 210b comprises an aluminum oxide layer. In some embodiment, the data retention layer 210b may also comprise hydrogen dopants so as to increase performance of the data retention layer 210b and the multi-layer dielectric data storage layer 210. In some embodiments, the performance enhancing layer 210a may comprise a hydrogen-doped hafnium oxide ($HfO_x$) layer and the data retention layer 210b may comprise a hafnium aluminum oxide ($HfAlO_x$) layer. In such embodiments, having the hydrogen-doped hafnium oxide ($HfO_x$) layer disposed between the hafnium aluminum oxide ($HfAlO_x$) layer and the bottom electrode 208 increases yield of the RRAM cell 200 by greater than 20%.

In some embodiments, the performance enhancing layer 210a may comprise a high rate of $Vo^{2+}$ oxygen vacancies. The $Vo^{2+}$ oxygen vacancies have a relatively low activation energy (e.g., 0.7 eV compared to $Vo^0$ and $Vo^+$ vacancies, which respectively have activation energies of 2.4 eV and 1.5 eV). The low activation energy of the $Vo^{2+}$ oxygen vacancies makes the migration of oxygen vacancies in the performance enhancing layer 210a easier. Since the resistance of an RRAM cell changes by inducing conductive paths/filaments (e.g., comprising oxygen vacancies) to form across the performance enhancing layer 210a, the low activation energy of the $Vo^{2+}$ oxygen vacancies improves the performance of the RRAM cell 200. In some embodiment, the data retention layer 210b may also comprise a high rate of $Vo^{2+}$ oxygen vacancies so as to increase performance of the data retention layer 210b In some embodiments, the data retention layer 210b may comprise a hafnium aluminum oxide ($HfAlO_x$) layer having a stacked structure that alternates between one or more layers of hafnium oxide (HfO) 209a and one or more layers of aluminum oxide (AlO) 209b. In some embodiments, the hafnium aluminum oxide ($HfAlO_x$) layer has an aluminum content that is in a range of between approximately 30% and approximately 65%. It will be appreciated that the concentration of the hafnium aluminum oxide ($HfAlO_x$) layer may be varied by varying the size and/or a number of the layers of hafnium oxide (HfO) 209a and aluminum oxide (AlO) 209b. For example, to provide the hafnium aluminum oxide ($HfAlO_x$) layer with a larger hafnium (Hf) content than aluminum (Al) content, the layers of hafnium oxide (HfO) 209a may have a greater thickness than abutting layers of aluminum oxide (AlO) 209b, and/or the number of layers of hafnium oxide (HfO) 209a may be greater than the number of layers of aluminum oxide (AlO) 209b.

In some embodiments, the data retention layer 210b has a second thickness $t_2$ that is in a range of between approximately 1 and approximately 10 times thicker than a first thickness $t_1$ of the performance enhancing layer 210a. For example, in some embodiments, the data retention layer 210b has a second thickness $t_2$ in a range of between approximately 10 angstroms (Å) and approximately 40 Å, while the performance enhancing layer 210a has a first thickness $t_1$ in a range of between approximately 5 Å and approximately 40 Å.

A top electrode 214, comprising a conductive material (e.g., titanium, titanium nitride, tantalum, tantalum nitride, etc.) is located over the multi-layer dielectric data storage layer 210. In some embodiments, a capping layer 212 may be disposed between the top electrode 214 and the multi-layer dielectric data storage layer 210. The capping layer 212 is configured to store oxygen, which can facilitate resistance changes within the multi-layer dielectric data storage layer 210. In some embodiments, the capping layer 212 may comprise a metal or a metal oxide that is relatively low in oxygen concentration.

An overlying masking layer 216 (e.g., a hard mask layer) may be disposed over the top electrode 214. In some embodiments, the masking layer 216 may comprise a silicon oxynitride (SiON) hard mask layer, a silicon dioxide (SiO$_2$) hard mask layer, or a PE-SiN hard mask. In some embodiments, an upper inter-level dielectric (ILD) layer 220 is disposed over the masking layer 216 at a position surrounding an upper metal interconnect layer 222 disposed onto the top electrode 214. The upper metal interconnect layer 222 comprises the upper metal via 222a, which extends through the masking layer 216 from the top electrode 214 to an upper metal wire 222b.

Figure 3:
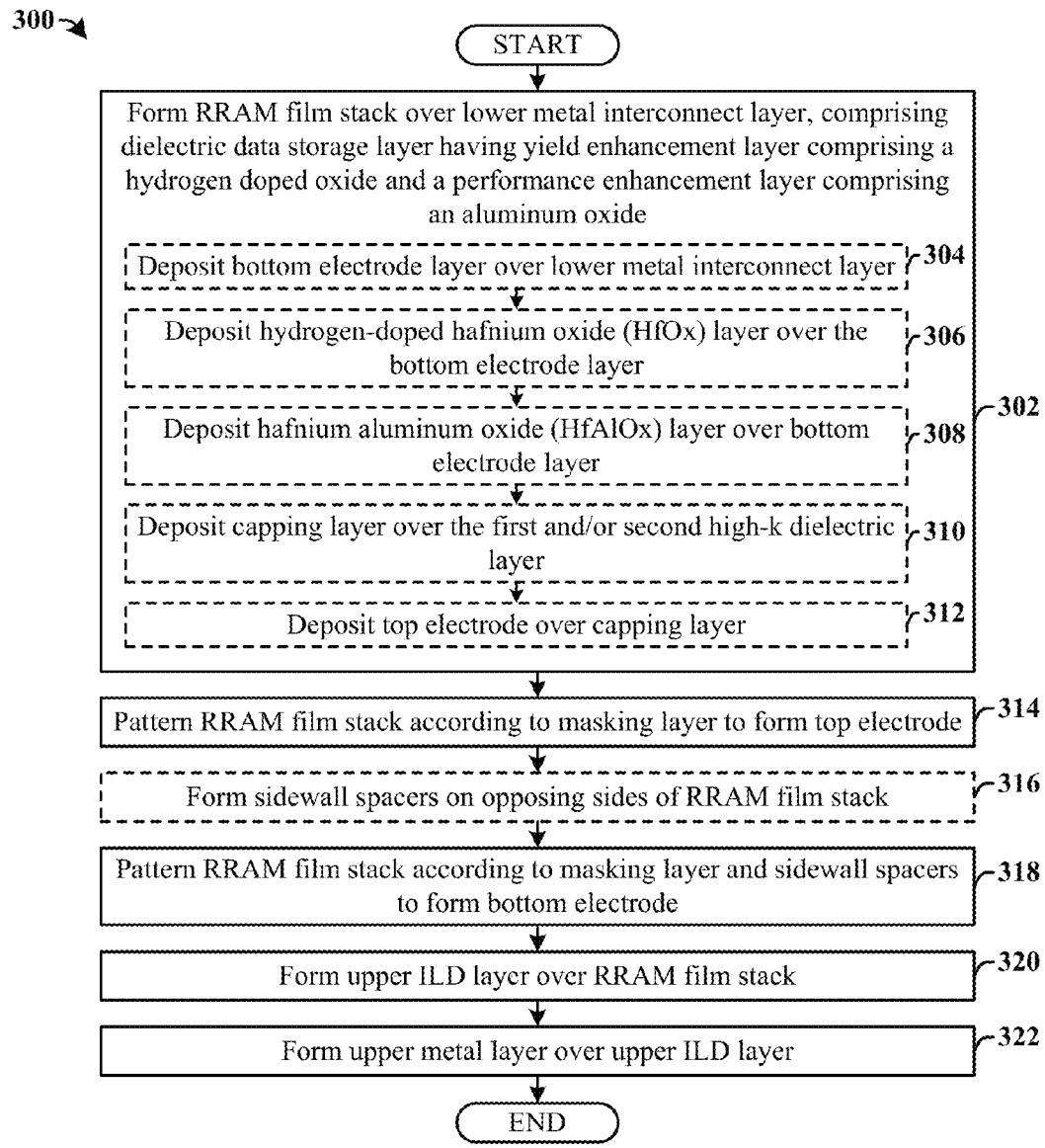
FIG. 3 illustrates a flow diagram of some embodiments of a method of forming an integrated chip comprising an RRAM memory cell having a dielectric data storage layer with a performance enhancing layer and a data retention layer.

FIG. 3 illustrates a flow diagram of some embodiments of a method 300 of forming an integrated chip comprising a RRAM structure having a dielectric data storage layer with a performance enhancing layer and a data retention layer.

While the disclosed method 300 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302, an RRAM (resistive random access memory) film stack is formed over a lower metal interconnect layer disposed within a lower inter-level dielectric (ILD) layer. In some embodiments, the RRAM film stack comprises a dielectric data storage layer disposed between a bottom electrode layer and a top electrode layer. The dielectric data storage layer has a performance enhancing layer comprising a hydrogen-doped oxide and a data retention layer comprising an aluminum oxide. In some embodiments, the RRAM film stack may be formed according to acts 304-312, as described below.

In some embodiments, the RRAM film stack may be formed by first depositing the bottom electrode layer over a semiconductor substrate, at 304. The dielectric data storage layer is then formed by forming a hydrogen-doped hafnium oxide (HfO$_x$) layer over the bottom electrode layer, at 306, and by forming a hafnium aluminum oxide (HfAlO$_x$) layer over the bottom electrode layer, at 308. In some embodiments, the hydrogen-doped hafnium oxide (HfO$_x$) and the hafnium aluminum oxide (HfAlO$_x$) layer may be formed in-situ. In some embodiments, a capping layer may be formed over the hafnium aluminum oxide (HfAlO$_x$) layer, at 310. The top electrode layer is formed over the capping layer, at 312

At 314, the RRAM film stack is patterned according to a masking layer to form a top electrode.

At 316, sidewall spacers may be formed on opposing sides of a patterned RRAM film stack, in some embodiments.

At 318, the RRAM film stack is further patterned to form a bottom electrode.

At 320, an upper inter-level dielectric (ILD) layer is formed over the RRAM film stack.

At 322, upper metal interconnect layer is formed over the upper ILD layer. The upper metal interconnect layer extends to a position in electrical contact with the top electrode.

FIGS. 4A-8 illustrate some embodiments of cross-sectional views showing a method of forming a RRAM cell having a multi-layer dielectric data storage layer. Although FIGS. 4A-8 are described in relation to method 300, it will be appreciated that the structures disclosed in FIGS. 4A-8 are not limited to such a method, but instead may stand alone as structures independent of the method.

FIGS. 4A-4F illustrates some embodiments of cross-sectional views corresponding to act 302.

Figure 4A:
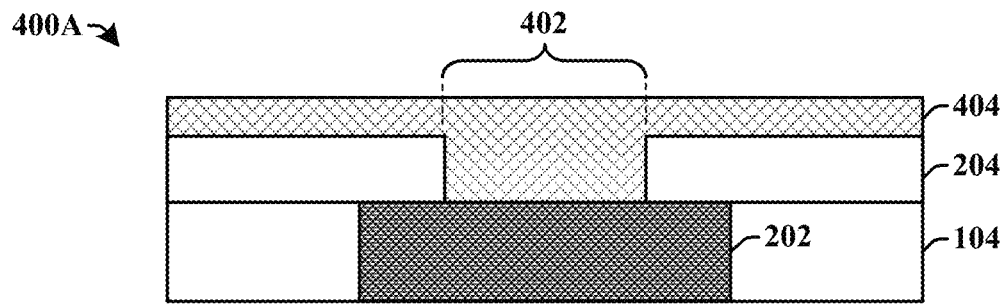
FIGS. 4A-8 illustrates some embodiments of cross-sectional views showing a method of forming an integrated chip comprising an RRAM memory cell having a multi-layer dielectric layer.
Figure 4B:
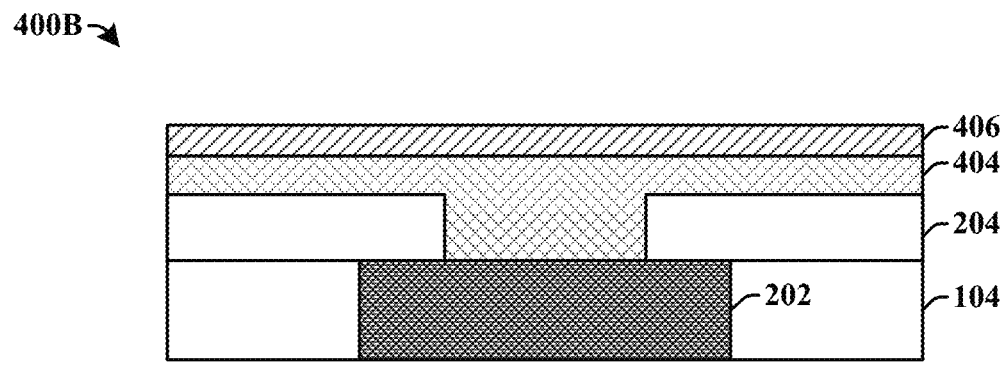

FIGS. 4A-4B illustrate cross-sectional views, 400A and 400B, corresponding to act 304.

As shown in cross-sectional view 400A, a lower metal interconnect layer 202 is formed within a lower inter-level dielectric (ILD) layer 104 (e.g., an oxide, a low-k dielectric, or an ultra low-k dielectric). In some embodiments, the lower metal interconnect layer 202 may be formed by selectively etching the lower ILD layer 104 (e.g., an oxide, a low-k dielectric, or an ultra low-k dielectric) to form an opening in the lower ILD layer 104. A metal (e.g., copper, aluminum, etc.) is then deposited to fill the opening, and a planarization process is performed to remove excess metal to form the lower metal interconnect layer 202.

A lower insulating layer 204, configured to act as an etch stop layer, is subsequently formed onto the lower metal interconnect layer 202 and/or the lower ILD layer 104. In some embodiments, the lower insulating layer 204 may comprise silicon-nitride (SiN), silicon-carbide (SiC), or a similar composite dielectric film. In some embodiments, the lower insulating layer 204 may be formed by a vapor deposition technique (e.g., physical vapor deposition, chemical vapor deposition, etc.). The lower insulating layer 204 is then selectively etched (e.g., using a dry etchant) to form a cavity or micro-trench 402, which extends through the lower insulating layer 204 to the lower metal interconnect layer 202.

A diffusion barrier layer 404 may be formed over the lower metal interconnect layer 202 and the lower insulating layer 204. The diffusion barrier layer 404 may be deposited into the micro-trench 402, so that the diffusion barrier layer 404 abuts the lower metal interconnect layer 202. In some embodiments, the diffusion barrier layer 404 may be deposited by a deposition technique and the subjected to a planarization process (e.g., a chemical mechanical polishing process) that gives the diffusion barrier layer 404 a planar top surface. In some embodiments, the diffusion barrier layer 404 may extend from within the micro-trench 402 to a position overlying the lower insulating layer 204. In some embodiments, the diffusion barrier layer 404 may comprise a conductive oxide, nitride, or oxynitride of a metal such as aluminum (Al), manganese (Mn), cobalt (Co), titanium (Ti), tantalum (Ta), tungsten (W), nickel (Ni), tin (Sn), magnesium (Mg), and combinations thereof. The diffusion barrier layer 404 may have a thickness in the range of between approximately 10 Å and approximately 300 Å.

As shown in cross-sectional view 400B, a bottom electrode layer 406 is formed over the diffusion barrier layer 404. The bottom electrode layer 406 may be formed by way of a vapor deposition technique (e.g., a chemical vapor deposition, a physical vapor deposition, a plasma enhanced CVD, etc.). In some embodiments, the bottom electrode layer 406 may comprise one or more of tantalum (Ta), tantalum nitride (TaN), titanium (Ti), or titanium nitride (TiN), for example.

Figure 4C:
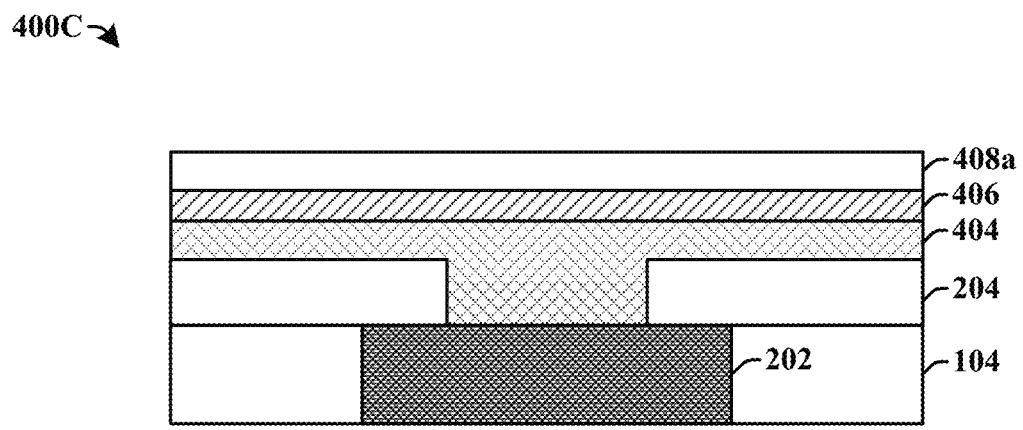

FIG. 4C illustrates some embodiments of a cross-sectional view 400C, corresponding to act 306.

As shown in cross-sectional view 400C, a performance enhancing layer comprising a hydrogen-doped hafnium oxide ($HfO_x$) layer 408a is formed onto the bottom electrode layer 406. In some embodiments, the hydrogen-doped hafnium oxide ($HfO_x$) layer 408a may be formed using a first atomic layer deposition (ALD) process that alternatively introduces pulses of a hafnium tetrachloride ($HfCl_4$) precursor gas and a water ($H_2O$) precursor gas into a processing chamber.

For example, the first ALD process may introduce a hafnium tetrachloride ($HfCl_4$) precursor gas in a processing chamber for a first pulse time $t_{p1}$ to form a monolayer of hafnium tetrachloride ($HfCl_4$) on the bottom electrode layer 406. The first ALD process then purges the hafnium tetrachloride ($HfCl_4$) precursor gas from the processing chamber, and introduces a water ($H_2O$) precursor gas into the processing chamber for a second pulse time $t_{p2}$, before purging the water ($H_2O$) precursor gas from the processing chamber. The water ($H_2O$) precursor gas interacts with the monolayer of hafnium tetrachloride ($HfCl_4$) to form a layer of hafnium oxide ($HfO_x$) on the bottom electrode layer 406. In some embodiments, the hafnium oxide ($HfO_x$) layer 408a may be formed using a long water ($H_2O$) precursor gas pulse time (i.e., a long second pulse time $t_{p2}$), which enriches the hafnium oxide ($HfO_x$) layer 408a with hydrogen molecules, reduces chlorine (Cl) and provide for a high concentration of $Vo^{2+}$ oxygen vacancies. For example, the second pulse time $t_{p2}$ may be two or more times longer than the first pulse time $t_{p1}$. In some embodiments, the second pulse time $t_{p2}$ may be in a range of between approximately 1000 ms and approximately 2000 ms.

Figure 4D:
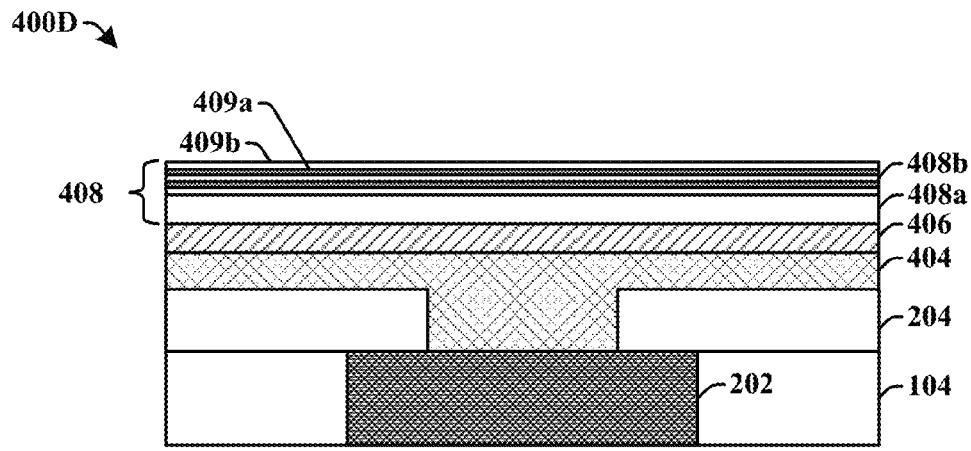

FIG. 4D illustrates some embodiments of a cross-sectional view 400D, corresponding to act 308.

As shown in cross-sectional view 400D, a data retention layer comprising a hafnium aluminum oxide ($HfAlO_x$) layer 408b is deposited over the hydrogen-doped hafnium oxide ($HfO_x$) layer 408a. In some embodiments, the hydrogen-doped hafnium oxide ($HfO_x$) layer 408a and the hafnium aluminum oxide ($HfAlO_x$) layer 408b may collectively comprise a multi-layer dielectric data storage layer 408.

In some embodiments, depositing the hafnium aluminum oxide ($HfAlO_x$) layer 408b may be performed using a second atomic layer deposition (ALD) process. The second ALD process alternates between cycles that deposit aluminum oxide (AlO) layers 409a and cycles that deposit hafnium oxide (HfO) layers 409b. For example, the hafnium aluminum oxide ($HfAlO_x$) layer 408b may be deposited by performing a first number of cycles to deposit a first number of layers of aluminum oxide (AlO) layers 409a, and by performing a second number of cycles to deposit a second number of layers of hafnium oxide (HfO) layers 409b at positions abutting one or more of the first number of aluminum oxide (AlO) layers 409a.

In some embodiments, the hafnium aluminum oxide ($HfAlO_x$) layer has an aluminum content that is in a range of between approximately 30% and approximately 65%. It will be appreciated that the concentration of the hafnium aluminum oxide ($HfAlO_x$) layer may be varied by varying the size and/or number of the layers of hafnium oxide (HfO) 209a and aluminum oxide (AlO) 209b. In some embodiments, the second number of cycles may be less than the first number of cycles. For example, the first number of cycles may be in a range of between approximately 1 cycle and approximately 8 cycles, and the second number of cycles may be in a range of between approximately 1 cycle and approximately 4 cycles.

In some embodiments, the second ALD process may form the data retention layer using a long $H_2O$ pulse (e.g., an $H_2O$ pulse in a range of between approximately 1000 ms and approximately 2000 ms). In such embodiments, the long $H_2O$ pulse will provide the data retention layer with a hydrogen doping and a high rate of $Vo^{2+}$ oxygen vacancies that improve performance of the data retention layer and therefore the multi-layer dielectric data storage layer 408.

Figure 4E:
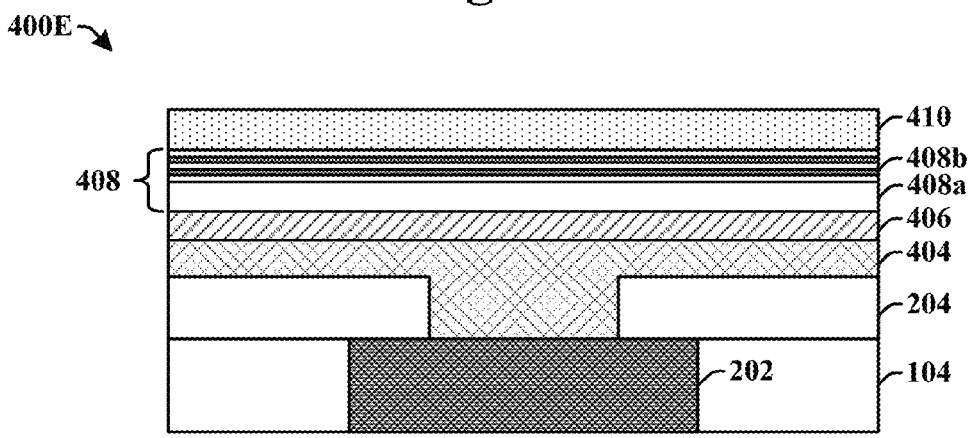

FIG. 4E illustrates some embodiments of a cross-sectional view 400E, corresponding to act 310.

As shown in cross-sectional view 400E, a capping layer 410 may be formed onto the multi-layer dielectric data storage layer 408. In some embodiments, the capping layer 410 may comprise a metal such as titanium (Ti), hafnium (Hf), platinum (Pt), tantalum (Ta), and/or aluminum (Al). In other embodiments, the capping layer 410 may comprise a metal oxide such as titanium oxide ($TiO_x$), hafnium oxide ($HfO_x$), zirconium oxide ($ZrO_x$), germanium oxide ($GeO_x$), cesium oxide ($CeO_x$) In some embodiments, the capping layer 410 may have a thickness in a range of between approximately 20 Å and approximately 100 Å.

Figure 4F:
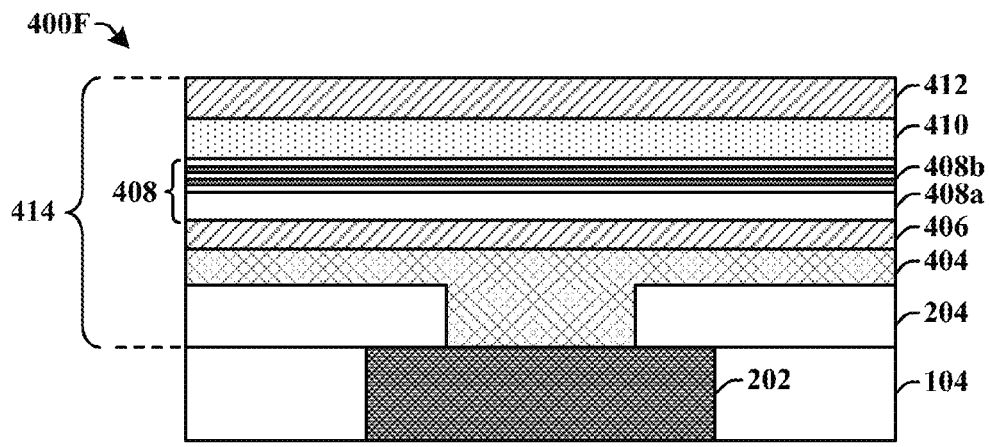

FIG. 4F illustrates some embodiments of a cross-sectional view 400F, corresponding to act 312.

As shown in cross-sectional view 400F, a top electrode layer 412 is formed over the capping layer 410 to form the RRAM film stack 414. The top electrode layer 412 may be formed by way of a vapor deposition technique (e.g., a chemical vapor deposition, a physical vapor deposition, a plasma enhanced CVD, etc.). In some embodiments, the top electrode layer 412 may comprise one or more of tantalum (Ta), tantalum nitride (TaN), titanium (Ti), titanium nitride (TiN), tungsten (W), Iridium (Ir) or platinum (Pt), for example.

Figure 5:
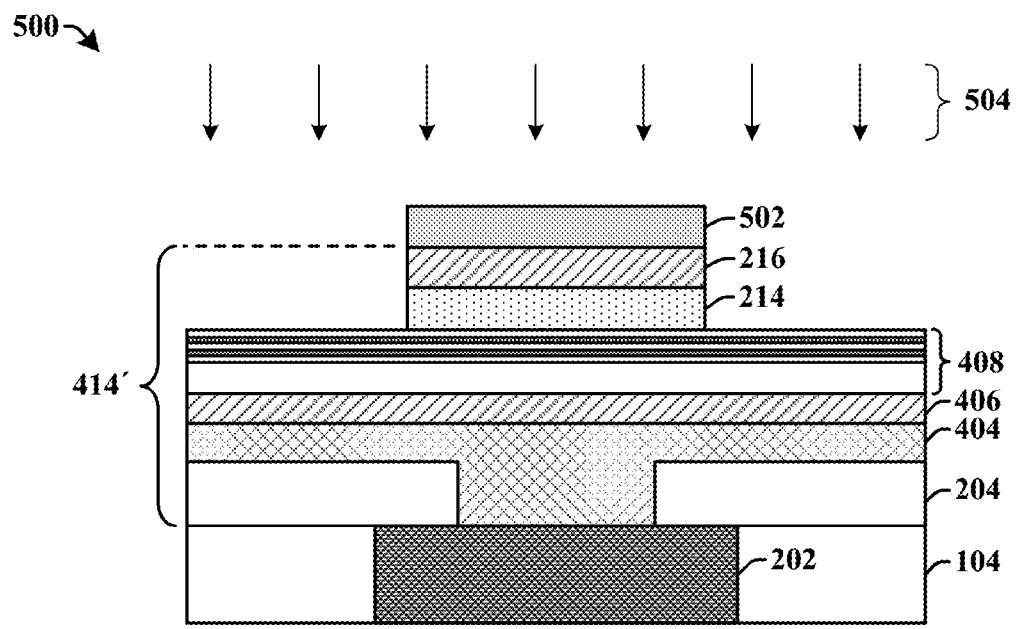

FIG. 5 illustrates some embodiments of a cross-sectional view 500 corresponding to act 314.

As shown in cross-sectional view 500, the RRAM film stack 414 is patterned according to a masking layer 502. The RRAM film stack 414 may be patterned to form a patterned RRAM film stack 414' by selectively exposing the RRAM film stack 414 to an etchant 504 in areas not covered by the masking layer 502. In some embodiments, the etchant 504 may comprise a dry etchant (e.g., a plasma etchant, a RIE etchant, etc.) configured to remove portions of the top electrode layer 514 and the capping layer 512. The dry etchant may comprise a plasma etch having an etching chemistry comprising fluorine (F) or argon (Ar), for example. In other embodiments, the etchant 504 may comprise a wet etchant comprising hydrofluoric acid (HF), for example.

Figure 6:
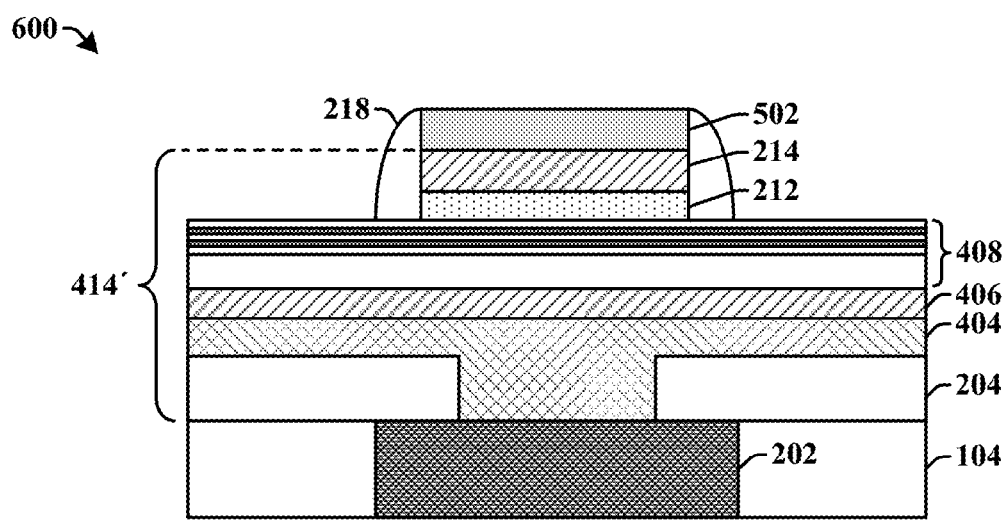

FIG. 6 illustrates some embodiments of a cross-sectional view 600 corresponding to act 316.

As shown in cross-sectional view 600, sidewall spacers 218 are formed on opposing sides of the top electrode 214 and the patterned capping layer 212. In some embodiments, the sidewall spacers 218 may be formed by depositing nitride onto the multi-layer dielectric data storage layer 408 and selectively etching the nitride to form the sidewall spacers 218.

Figure 7:
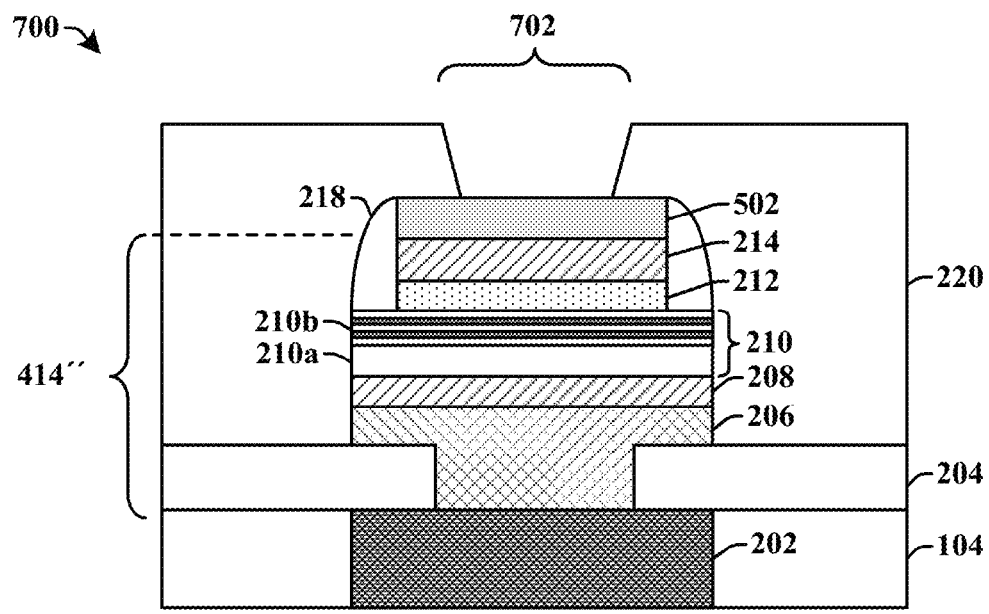

FIG. 7 illustrates some embodiments of a cross-sectional view 700 corresponding to act 318.

As shown in cross-sectional view 700, the RRAM film stack 414' is further patterned according to the masking layer 502 and the sidewall spacers 218 to define a bottom electrode 208. The RRAM film stack 414' may be patterned by selectively exposing the RRAM film stack 414' to an etchant (e.g., a dry etchant or a wet etchant) in areas not covered by the masking layer 502 and the sidewall spacers 218.

An upper inter-level dielectric (ILD) layer 220 is subsequently formed over patterned RRAM film stack 414''. The upper ILD layer 220 may be patterned to form a via hole 702 for a via configured to contact the top electrode 214. In some embodiments, the via hole 702 may be formed by etching the upper ILD layer 220 to form an opening that extends from a top surface of the upper ILD layer 220 to a position abutting the top electrode 214.

Figure 8:
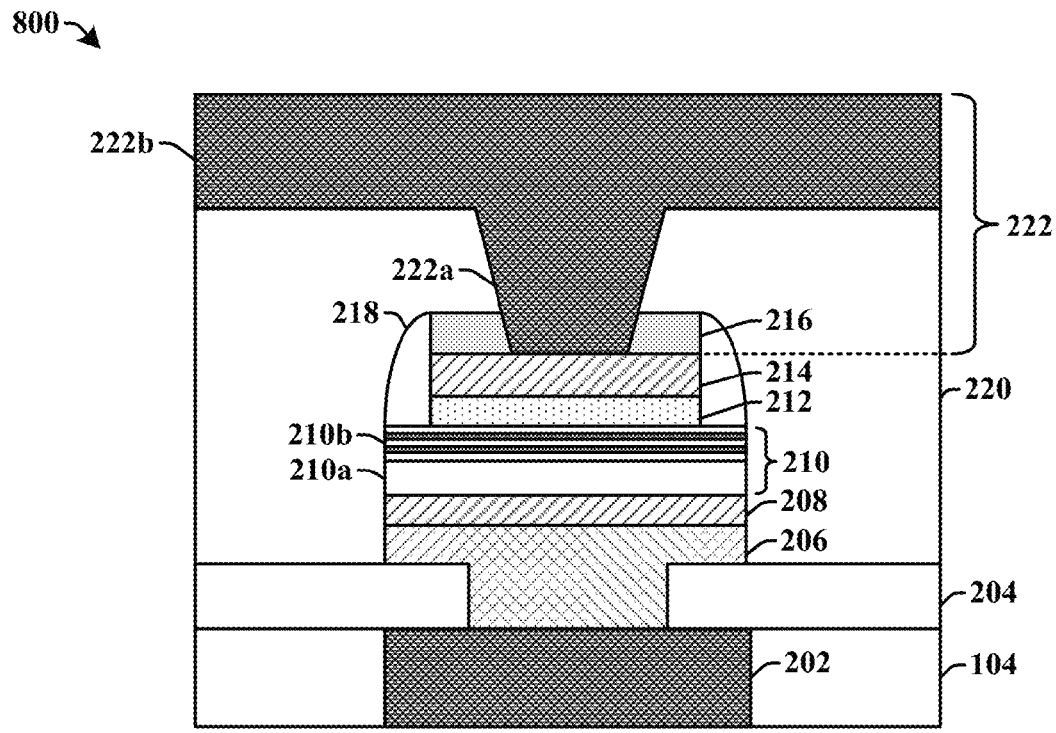

FIG. 8 illustrates some embodiments of a cross-sectional view 800 corresponding to act 320.

As shown in cross-sectional view 800, an upper metal interconnect layer 222 is formed at a position abutting the top electrode 214. In some embodiments, the upper metal interconnect layer 222 comprises an upper metal via 222a and an upper metal wire 222b. In some embodiments, the upper metal interconnect layer 222 may be formed by filing the via hole 702, and an overlying trench, with a metal (e.g., copper) to form the upper metal via 222a and the upper metal wire 222b, respectively.

Therefore, the present disclosure relates to a method of forming an RRAM cell comprising a dielectric data layer, having a performance enhancing layer and a data retention layer, which is configured to provide good performance, device yield, and data retention, and an associated apparatus.

In some embodiments, the present disclosure relates to a method of forming an RRAM (resistive random access memory) cell. The method comprises forming an RRAM film stack having a bottom electrode layer disposed over a semiconductor substrate, a top electrode layer, and a dielectric data storage layer disposed between the bottom electrode and the top electrode. The dielectric data storage layer comprises a performance enhancing layer having a hydrogen-doped oxide and a data retention layer comprising an aluminum oxide. The method further comprises patterning the RRAM film stack according to one or more masking layers to form a top elected and a bottom electrode, and forming an upper metal interconnect layer at a position electrically contacting the top electrode.

In other embodiments, the present disclosure relates to a method of forming an RRAM (resistive random access memory) cell. The method comprises depositing a bottom electrode layer over a lower metal interconnect layer, depositing a hydrogen-doped hafnium oxide ($HfO_x$) layer over the bottom electrode layer using a first ALD process, depositing a hafnium aluminum oxide ($HfAlO_x$) layer, having alternating layers of aluminum oxide (AlO) and hafnium oxide (HfO), onto the hafnium oxide ($HfO_x$) layer using a second ALD process, and depositing a top electrode layer over the hafnium aluminum oxide ($HfAlO_x$) layer. The method further comprises patterning the top electrode layer according to a masking layer to form a top electrode, and patterning the bottom electrode layer to form a bottom electrode. The method further comprises forming an upper metal interconnect layer at a position electrically contacting the top electrode.

In yet other embodiments, the present disclosure relates to an RRAM (resistive random access memory) cell. The RRAM cell comprises a bottom electrode disposed over a semiconductor substrate. The RRAM cell further comprises a dielectric data storage layer disposed over the bottom electrode, and comprising a performance enhancing layer including a hydrogen-doped oxide, and a data retention layer including an aluminum oxide. The RRAM cell further comprises a top electrode disposed over the dielectric data storage layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An RRAM (resistive random access memory) cell, comprising:
   a bottom electrode disposed over a semiconductor substrate;
   a dielectric data storage layer disposed over the bottom electrode, and comprising:
      a performance enhancing layer including a hydrogen-doped oxide contacting the bottom electrode; and
      a data retention layer comprising a hafnium aluminum oxide layer contacting the performance enhancing layer and including a stacked structure that alternates between layers of hafnium oxide and layers of aluminum oxide; and
   a top electrode disposed over the dielectric data storage layer.

2. The RRAM cell of claim 1,
   wherein the performance enhancing layer comprises a hydrogen-doped hafnium oxide (HfOx) layer.

3. The RRAM cell of claim 2, wherein the hafnium aluminum oxide ($HfAlO_x$) layer has an aluminum content in a range of between approximately 30% and approximately 65%.

4. The RRAM cell of claim 2,
   wherein the hydrogen-doped hafnium oxide ($HfO_x$) layer has a first thickness in a range of between approximately 5 angstroms (Å) and approximately 40 Å; and
   wherein the hafnium aluminum oxide ($HfAlO_x$) layer has a second thickness in a range of between approximately 10 Å and approximately 40 Å.

5. The RRAM cell of claim 1, wherein the data retention layer is disposed onto and in direct contact with a top surface of the performance enhancing layer.

6. The RRAM cell of claim 1, wherein the data retention layer comprises a hydrogen-doped hafnium aluminum oxide ($HfAlO_x$) layer.

7. An RRAM (resistive random access memory) cell, comprising:
   a bottom electrode disposed over a semiconductor substrate;
   a dielectric data storage layer disposed over the bottom electrode and having a variable resistance, wherein the dielectric data storage layer comprises a performance enhancing layer including a hydrogen-doped oxide and an overlying data retention layer comprising a stacked structure that alternates between layers of hafnium oxide and layers of aluminum oxide;

a cap layer arranged over the dielectric data storage layer; and a top electrode arranged over the cap layer.

8. The RRAM cell of claim 7, wherein the performance enhancing layer comprises hydrogen-doped oxide.

9. The RRAM cell of claim 8, wherein the data retention layer comprises hafnium aluminum oxide.

10. The RRAM cell of claim 9, wherein an aluminum content of the data retention layer is in a range of between approximately 30% and approximately 65%.

11. The RRAM cell of claim 9, wherein the stacked structure comprises alternating layers of aluminum oxide and hafnium oxide.

12. The RRAM cell of claim 11, wherein the stacked structure comprises a first number of layers of aluminum oxide and a second number of layers of hafnium oxide that is greater than the first number.

13. The RRAM cell of claim 11, wherein the data retention layer has a lower surface facing the performance enhancing layer, which comprises a hafnium oxide layer.

14. The RRAM cell of claim 8, wherein the data retention layer comprises hydrogen doped hafnium aluminum oxide.

15. The RRAM cell of claim 7, wherein the data retention layer has a thickness that is greater than or equal to a thickness of the performance enhancing layer.

16. The RRAM cell of claim 7, further comprising:
a masking layer disposed over the top electrode; and
an upper metal via extending through the masking layer to the top electrode.

17. The RRAM cell of claim 7, wherein the performance enhancing layer contacts an upper surface of the bottom electrode and the data retention layer contacts a lower surface of the cap layer.

18. The RRAM cell of claim 7,
wherein the performance enhancing layer and the data retention layer have sidewalls that are aligned with one another and that are laterally offset from sidewalls of the top electrode; and
wherein the cap layer has sidewalls that are offset from the sidewalls of the data retention layer.

19. An RRAM (resistive random access memory) cell, comprising:
a bottom electrode disposed over a semiconductor substrate;
a hydrogen-doped hafnium oxide layer disposed onto the bottom electrode;
a hafnium aluminum oxide layer disposed onto and in direct contact with a top surface of the hydrogen-doped hafnium oxide layer; and
a top electrode arranged over the hafnium aluminum oxide layer.

20. The RRAM cell of claim 19, further comprising:
a cap layer arranged onto and in direct contact with the hafnium aluminum oxide layer.

* * * * *